United States Patent [19]

Dreifus et al.

[11] Patent Number: 5,536,953
[45] Date of Patent: Jul. 16, 1996

[54] WIDE BANDGAP SEMICONDUCTOR DEVICE INCLUDING LIGHTLY DOPED ACTIVE REGION

[75] Inventors: David L. Dreifus; Bradley A. Fox, both of Cary; Jesko A. von Windheim, Raleigh, all of N.C.

[73] Assignee: Kobe Steel USA, Research Triangle Park, N.C.

[21] Appl. No.: 208,018

[22] Filed: Mar. 8, 1994

[51] Int. Cl.$^6$ .................. H01L 31/0312; H01L 29/82; H01L 29/167
[52] U.S. Cl. .............. 257/77; 257/76; 257/418; 257/421; 257/609
[58] Field of Search .............. 257/76–78, 279, 257/609, 610, 928, 924, 913, 418, 419, 421, 425

[56] References Cited

U.S. PATENT DOCUMENTS

| | | | |
|---|---|---|---|
| 3,617,975 | 10/1969 | Weider | 257/425 |
| 4,963,954 | 10/1990 | Hälg et al. | 257/418 |
| 5,162,886 | 11/1992 | Nishibayashi et al. | 257/421 |
| 5,183,530 | 2/1993 | Yamazaki | 156/643 |
| 5,223,721 | 6/1993 | Iida et al. | 257/77 |
| 5,231,301 | 7/1993 | Peterson et al. | 257/419 |
| 5,252,840 | 10/1993 | Shiomi et al. | 257/77 |
| 5,278,430 | 1/1994 | Kakumu | 257/77 |
| 5,285,089 | 2/1994 | Das | 257/77 |
| 5,289,017 | 2/1994 | Nii | 257/77 |

FOREIGN PATENT DOCUMENTS 4-26172   1/1992   Japan .

OTHER PUBLICATIONS

R. E. Harper et al., *Contacts to Doped and Undoped Polycrystalline Diamond Films*, Diamond and Related Materials, 1 (1992), 692–696.

S. A. Grot, et al., *Diamond Thin–Film Recessed Gate Field–Effect Transistors Fabricated by Electron Cyclotron Resonance Plasma Etching*, IEEE Electron Device Letters, vol. 13, No. 9, Sep. 1992, pp. 462–464.

Krishna Shemai, et al., *Optimum Semiconductors for High–Power Electronics*, IEEE Transactions on Electron Devices, vol. 36, No. 9, Sep. 1989, pp. 1811–1823.

Alan T. Collins, *Diamond electronic devices—can they outperform silicon or GaAs?*, Materials Science and Engineering, B11 (1992), pp. 257–263.

A. T. Collins, et al., *The Properties of Diamond*, (J. F. Field, ed.) 79 Academic Press, London, 1979, pp. 79–105.

G. Gildenblat, et al., *Simple Model of Diamond Depletion–Type MOSFET*, Solid State Electronics, vol. 36, No. 5 (1993), pp. 791–792.

J. A. Von Windheim, et al., *Electrical Characterization of Semiconducting Diamond Thin Films and Single Crystals*, Journal of Electronic Materials, vol. 22, No. 4 (1993), pp. 391–398.

Naoji Fujimori, et al., *Diamond devices made of epitaxial diamond films*, Diamond and Related Materials, I (1992), pp. 665–668.

A. J. Tessmer, et al., *Polycrystalline diamond field–effect transistors*, Diamond and Related Materials, I (1992), pp. 89–92.

Alan T. Collins, *The optical and electronic properties of semiconducting diamond*, Phil. Trans. R. Soc. London A (1993) 342, pp. 233–244.

I. M. Buckley–Golder, et al., *Active electronic applications for diamond*, Diamond and Related Materials, I (1992), pp. 1083–1101.

Art Morrish, et al., Patent Application Entitled: *Method of Synthesizing High Quality, Doped Diamonds and Diamonds and Devices Obtained Therefrom*, Serial No. 747,321, Filed: Aug. 20, 1991, Publication No. 92–12266.

*Primary Examiner*—Mahshid Saadat
*Attorney, Agent, or Firm*—Bell, Seltzer, Park & Gibson

[57] ABSTRACT

A semiconductor device for providing stable operation over a relatively wide temperature range includes a wide bandgap semiconductor active region having an intentional dopant of a first conductivity type and an unintentional impurity of a second conductivity type which together produce a free carrier concentration at room temperature. The concentration of the intentional dopant in the active region is preferably less than $1\times10^{16}$ cm$^{-3}$ and the concentration of the unintentional impurity is less than 0.1 times the intentional dopant concentration so that the intentional dopant concentration will be less than 1000 times the free carrier concentration at room temperature. The intentional dopant concentration supplies substantially all the majority free carriers in the active region. The wide bandgap semiconductor active region is preferably diamond, IV-IV carbides, III-V nitrides and phosphides and II-VI selenides, tellurides, oxides and sulfides. By lightly doping the active region to a level below $1\times10^{16}$ cm$^{-3}$, relatively uniform device characteristics can be achieved over a wide temperature range extending from room temperature to 1000 K and above.

10 Claims, 11 Drawing Sheets

WIDE BANDGAP SEMICONDUCTOR DEVICE INCLUDING LIGHTLY DOPED ACTIVE REGION

FIELD OF THE INVENTION

The present invention relates to semiconductor devices and more particularly to devices having active regions formed of diamond and/or other wide bandgap semiconductor materials.

BACKGROUND OF THE INVENTION

An electronic device may be fabricated from one or more conventional semiconductor materials, such as silicon (Si), germanium (Ge) and gallium arsenide (GaAs) and include regions of N- and P-type conductivity which are tailored for particular device applications. Thus, selection of a semiconductor material is based not only on the material's inherent characteristics such as: bandgap, band type (direct or indirect), carrier mobility and effective mass, dielectric constant and lattice constant and structure, but also based on the type and concentration of the impurity (donor or acceptor) used in the device's intentionally doped active region(s).

Accordingly, control of a semiconductor material's characteristics can be achieved by including selected amounts and types of electrically active dopants to form N- and P-type regions of varying electrical conductivity and carrier mobility. The inclusion of dopants into semiconductor materials can be achieved using conventional processing techniques, such as in-situ doping, deposition, diffusion and ion-implantation. Many semiconductor devices include various intentionally doped N- and P-type regions to cause the semiconductor material to have uniform characteristics over a relatively wide temperature range.

The electrical behavior of a semiconductor depends primarily on the number of free charge carriers (electrons or holes) and the associated carrier mobility. In particular, conventional doped semiconductors, such as N-type silicon, exhibit three distinct regions of operation. These regions are graphically illustrated in FIG. 1, where the free electron carrier concentration (n) is plotted as a function of inverse temperature. These regions are the ionization, extrinsic and intrinsic regions, as shown. At very low temperatures near absolute zero (0 K), N- or P-type dopants are not electrically active to contribute to the semiconductor's conductivity. Electrical activation involves the giving up an electron by a donor (N-type) impurity, or the capture of an electron from the valence band by an acceptor (P-type) impurity. However, as the temperature is increased, a percentage of the dopants are activated through thermal ionization, thereby yielding free carriers and increasing the material's conductivity. In the ionization region, the free carrier concentration increases exponentially as a function of temperature.

Figure 1:
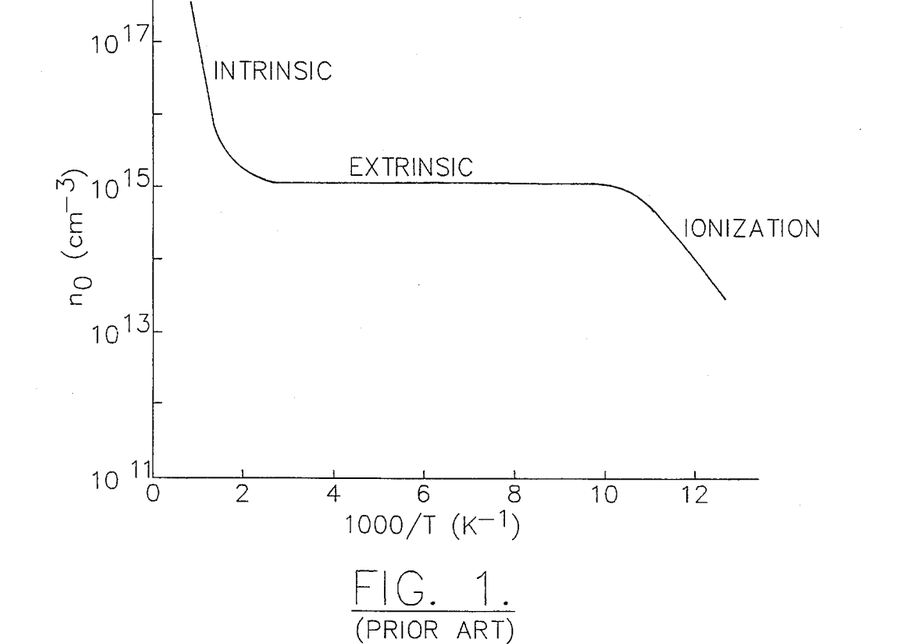
FIG. 1 is a graph illustrating free carrier concentration (n) versus inverse temperature for silicon having an intentional donor concentration of $10^{15}$ cm$^{-3}$ as in the prior art.

At higher temperatures, the thermal energy eventually becomes sufficient to fully ionize the intentional dopants. This region, which occurs when the thermal energy exceeds the donor activation energy for N-type material, or exceeds the acceptor activation energy for P-type material, is referred to as the extrinsic region of operation. As illustrated, the free carrier concentration (n) in a conventional doped semiconductor such as Ge, Si or GaAs is substantially uniform throughout the entire extrinsic region. The donor and acceptor activation energies are functions of the depth of the corresponding intentional impurity in the bandgap, either with respect to the conduction band edge ($E_c$) or valence band edge ($E_v$), respectively. Donor and acceptor activation energies may also be functionally dependent on the concentrations of the corresponding intentional dopant impurities, through an inverse relationship.

At even higher temperatures, the thermal energy approaches that required to generate intrinsic carriers in substantially greater concentration than the already fully activated intentional impurities. This is an intrinsic property of a conventional semiconductor and which depends on the magnitude of the bandgap energy ($E_g$). The bandgaps for Ge, Si and GaAs are 0.66 eV, 1.1 eV and 1.42 eV, respectively.

Figure 2:
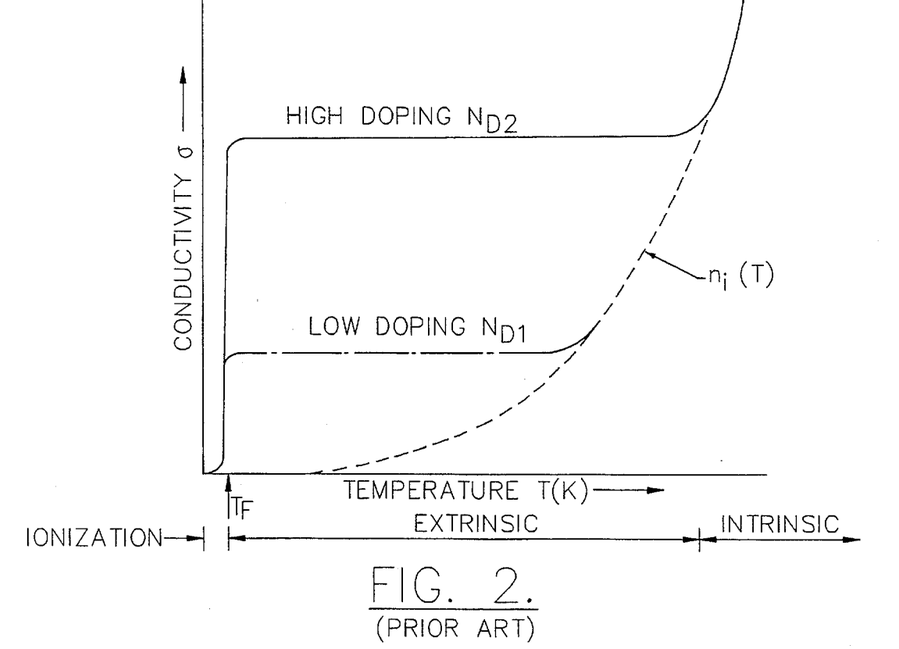
FIG. 2 is a graph illustrating conductivity (σ) versus temperature for an intentionally doped N-type conventional semiconductor as in the prior art.

Once the intrinsic carrier density from thermal generation exceeds the concentration due to the intentional dopant, the semiconductor exhibits intrinsic behavior dominated by the intrinsic conductivity of the semiconductor. This is shown graphically in FIG. 2 for both lightly and highly doped N-type semiconductors ($N_{D1}$ and $N_{D2}$ respectively). For N- and P-type conventional semiconductors having non-negligible degrees of compensation, the intrinsic carrier density $n_i$ or $p_i$ exceeds $N_d-N_a$ or $N_a-N_d$, respectively. The conductivity of an N- or P-type semiconductor rises abruptly at $T_f$, which is the freeze-out temperature (i.e., the temperature at which the thermal energy is insufficient to activate the dopant impurities).

Figure 3:
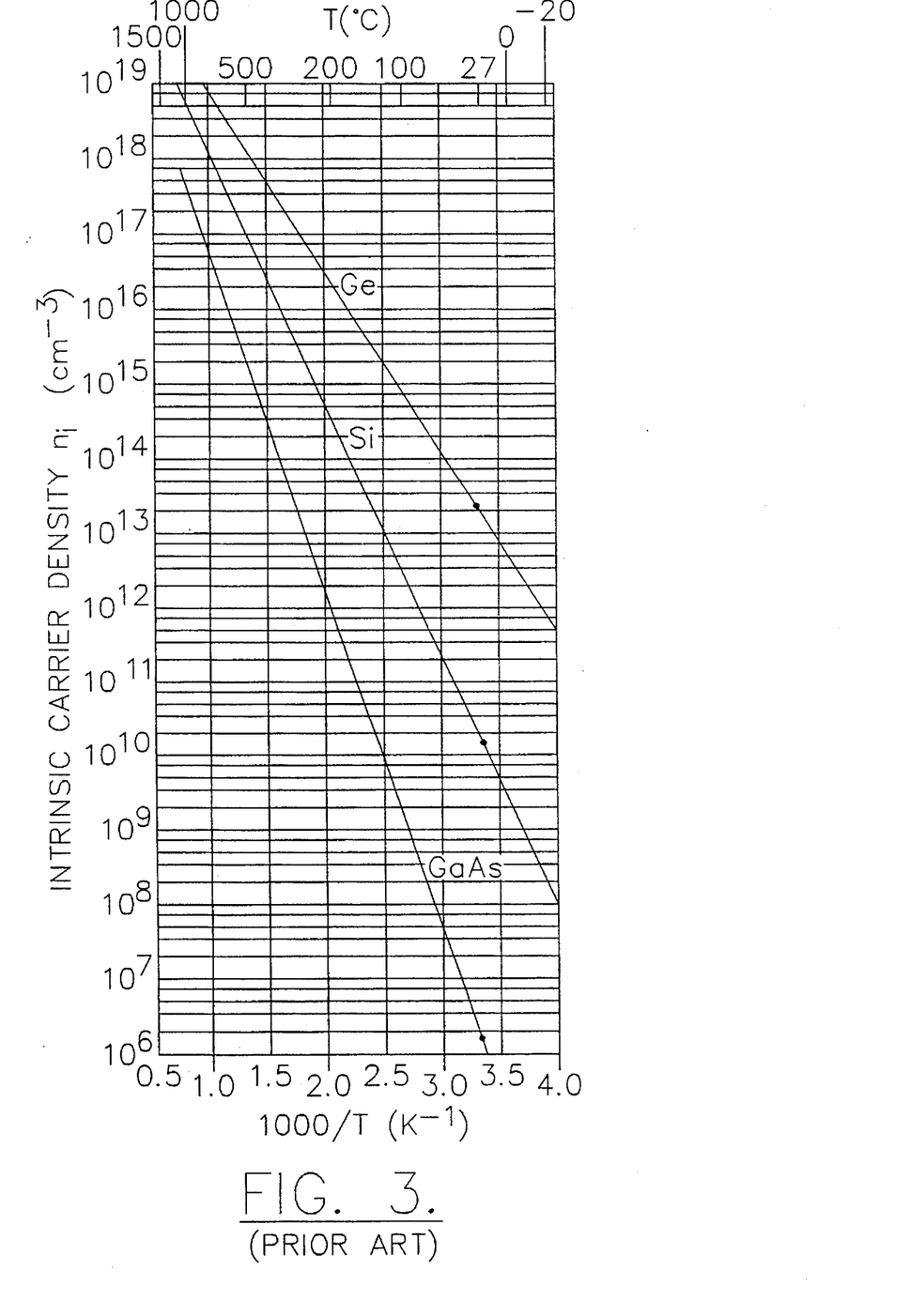
FIG. 3 is a graph illustrating intrinsic carrier densities of Ge, Si and GaAs as a function of reciprocal temperature as in the prior art.

The intrinsic carrier concentration for Ge, Si and GaAs as a function of temperature is graphically illustrated in FIG. 3. As shown, these semiconductors exhibit extrinsic behavior at room temperature (300 K) when intentionally doped to a concentration greater than $1\times10^{14}$ cm$^{-3}$. Because conventional semiconductors such as Ge, Si and GaAs already exhibit extrinsic behavior at room temperature, attempts to extend the extrinsic region of operation have typically been directed towards extending the high temperature end of the extrinsic region. Such attempts typically include the steps of intentionally doping the semiconductor regions of an electronic device at relatively high levels so that the intrinsic carrier concentration will not exceed the intentional dopant concentration in the expected temperature range of operation.

Such steps are typically not necessary for relatively wide bandgap materials where $E_g$ is greater than 1.5 eV, because semiconductors having large $E_g$ typically do not experience intrinsic operation, except at extremely high temperatures on the order of 1000 K or higher and these temperatures typically exceed the thermal breakdown limits of the electronic device's other materials such as packaging, wiring and contacts and passivation. For example, a wide bandgap material such as diamond exhibits a negligible intrinsic carrier concentration of less than $1\times10^{10}$ cm$^{-3}$ at 1000 K.

Accordingly, for conventional semiconductors such as Si, Ge and GaAs, which can be doped with a wide variety of shallow donor and acceptor impurities having low activation energies, extrinsic operation over a temperature range extending to room temperature and even below can be readily achieved. However, correspondingly low temperature limits of extrinsic operation for wide bandgap semiconductors having relatively deep donor and acceptor impurities typically cannot be achieved. Typical wide bandgap semiconductors include: (i) diamond (C); (ii) IV-IV carbides (SiC and $Si_xGe_yC_{1-x-y}$); (iii) III-V nitrides and phosphides (cubic BN, CN, GaN, BP, $GaAs_{1-x}P_x$ (x=0.1→1) and $Al_xGa_{1-x}N_yP_{1-y}$); and (iv) II-VI selenides, tellurides, oxides and sulfides (CdSe, CdS, ZnS, $Zn_xCd_{1-x}S_ySe_{1-y}$, CdTe and ZnO).

Moreover, typical dopant impurities in diamond, SiC and GaN typically exhibit relatively large acceptor ionization energies of 0.35–0.37 eV, 0.2–0.7 eV and 0.16–0.22 eV, respectively. Accordingly, at doping levels on the order of $1\times10^{17}$ cm$^{-3}$ and higher, these materials are highly sensitive to fluctuations in temperature since most of the dopants do not become electrically active until temperatures well above room temperature are reached. This property makes wide bandgap materials with deep impurities suitable for applications requiring a high degree of temperature sensitivity, such as thermistor applications, but less suitable for applications requiring temperature insensitive operation over a wide temperature range extending from room temperature to 1000 K and above.

However, because wide bandgap semiconductors such as diamond are expected to offer significant increases in figures of merit for electronic devices, compared to devices formed from silicon and other conventional semiconductors, attempts have been made to promote operation in the extrinsic region while inhibiting operation in the temperature sensitive ionization region. This is in contrast to the widely recognized use of wide bandgap semiconductors for thermistor applications, which require operation in the temperature sensitive ionization region.

One such attempt to improve the thermal stability of electronic devices fabricated from a wide bandgap semiconductor such as diamond is disclosed in an article entitled *Active Electronic Applications for Diamond*, by I. M. Buckley-Golder and A. T. Collins, Diamond and Related Materials, Vol. 1, pp. 1083–1101 (1992). In this article, the authors proposed relatively high doping levels in order to obtain greater concentrations of active carriers for temperatures below 1250 K and to reduce the activation energy ($E_a$) of boron, the dopant impurity. Unfortunately, this leads to degraded device performance, by limiting the maximum depletion depth and preventing pinch-off in P-channel depletion-mode FETs and by limiting the hole mobility ($\mu_h$). Moreover, in order to significantly reduce the activation energy of boron in diamond, doping levels on the order $1\times10^{20}$ cm$^{-3}$ are believed to be required. However, as described in a book entitled *The Properties of Diamond*, Academic Press, London, 1979, edited by J. E. Field, researchers A. T. Collins and E. C. Lightowlers disclose that these high levels of doping lead to undesirable parasitic conduction mechanisms such as impurity band conduction which can significantly degrade device performance.

Another attempt to use highly doped wide bandgap semiconductors such as diamond to achieve extrinsic operation over a relatively wide temperature range is disclosed in an article by K. Shenai et al. entitled *Optimum Semiconductors for High-Power Electronics*, IEEE Transactions on Electron Devices, Vol. 36, No. 9, September 1989, pp. 1811–1823. In particular, Shenai et al. propose that acceptor concentrations in diamond on the order of $2\times10^{17}$ cm$^{-3}$ can be used to compensate for an expected decrease in hole carrier mobility at high operating temperatures. Shenai et al. also proposes that conductivity enhancement at high operating temperatures can be achieved with the aforementioned high doping concentrations. However, the Shenai et al. work has been questioned for using low temperature approximations to describe the high temperature characteristics of diamond. In particular, in an article by A. T. Collins, entitled *Diamond Electronic Devices—Can They Outperform Silicon or GaAs?*, Materials Science and Engineering, B11 (1992), pp. 257–263, a high temperature approximation of free carrier concentration (p), based on an intentional acceptor concentration of $7.7\times10^{17}$ cm$^{-3}$, was substituted for the low temperature approximations of Shenai et al. Based on the high temperature approximation, the conductivity of P-type diamond was shown to vary over two orders of magnitude from room temperature to 1000 K and was also shown to be below the conductivity of GaAs at all temperatures.

U.S. Pat. No. 5,252,840 to Shiomi et al. discloses another approach to achieving high temperature stability for a diamond semiconductor device. More particularly, the patent discloses a high doped diamond layer, greater than $10^{20}$ cm$^{-3}$ as a supplier of carriers and a undoped or low doped diamond layer as a conducting region of carriers and injecting the carriers from the high doped diamond into the non- or low-doped diamond by diffusion or an applied electric field. However, as noted in the patent, it is believed that no practical electronic device could be fabricated using only the non- or low-doped diamond layer.

Thus, notwithstanding the attempts to use wide bandgap semiconductors for operation over relatively wide temperature ranges, there continues to be need for a wide bandgap semiconductor device having relatively uniform characteristics extending over a relatively wide temperature range.

SUMMARY OF THE INVENTION

In view of the foregoing background, it is therefore an object of the present invention to provide a semiconductor device and method for making such a device having a wide bandgap semiconductor active region therein and having enhanced thermal stability extending from at least room temperature to 1000 K and above.

This and other objects, advantages and features of the present invention are provided by a semiconductor device which in one embodiment includes a diamond layer having a semiconducting active region therein, and wherein the semiconducting active region includes an intentional dopant of a first conductivity type and an unintentional impurity of a second conductivity type at respective concentrations to together produce at room temperature a compensated majority free carrier concentration of first conductivity type. Moreover, the intentional dopant concentration is preferably relatively low at less than $1\times10^{16}$ cm$^{-3}$ to thereby enhance thermal stability for the semiconductor device over a relatively wide temperature range. Furthermore, the device is designed so that the intentional dopant concentration in the active region supplies substantially all the majority free carriers in the active region, and does not rely on adjacent regions to supply majority free carriers.

The unintentional impurity concentration is also preferably less than the intentional dopant concentration so that a difference between the intentional dopant concentration and the unintentional impurity concentration is less than 1000 times a predetermined free carrier concentration at room temperature. More preferably, the unintentional impurity concentration is less than the intentional dopant concentration so that a difference between the intentional dopant concentration and the unintentional impurity concentration is less than 500 times the free carrier concentration at room temperature.

Preferably the unintentional impurity concentration is less than 0.1 times the intentional dopant concentration, and more preferably, the unintentional impurity concentration is less than 0.01 times the intentional dopant concentration. In addition, the intentional dopant has an ionization activation energy greater than 150 meV in the semiconducting active region. Typical dopants for wide bandgap semiconductors such as diamond include boron (B), aluminum (Al), phosphorus (P), beryllium (Be) and nitrogen (N).

In other embodiments of the invention, the relatively low doped semiconducting active region may be formed in other wide bandgap semiconductors including Group IV-IV carbides, such as SiC and $Si_xGe_yC_{1-x-y}$; Group III-V nitrides and phosphides such as cubic BN, CN, GaN, BP, $GaAs_{1-x}P_x$ (x=0.1→1) and $Al_xGa_{1-x}N_yP_{1-y}$; Group II-VI selenides, tellurides, oxides and sulfides such as $Zn_xCd_{1-x}S_ySe_{1-y}$, CdSe, CdS, ZnS, CdTe and ZnO; and other semiconductors having direct or indirect bandgap energies greater than 1.5 eV. Typical dopants such as Ga, Si, Ge, Sn, In, As, Sb, O, S, Se and Li which may have ionization activation energies greater than 150 meV in one or more of the aforementioned wide bandgap semiconductors are also included as potential dopants.

A field effect transistor may be readily provided having enhanced thermal stability in view of the relatively low doping according to the invention. The FET includes a wide bandgap semiconductor layer having a source region, a drain region and a semiconducting active region therein. The semiconducting active region includes an intentional dopant of a first conductivity type and an unintentional impurity of a second conductivity type at respective concentrations to together produce at room temperature a compensated majority free carrier concentration of first conductivity type, and wherein the intentional dopant concentration is relatively low at less than $1\times10^{16}$ cm$^{-3}$.

The FET also preferably includes gating means provided adjacent the semiconducting active region for modulating the active region. In one embodiment, the gating means is preferably provided by a Schottky barrier rectifying contact on the active region. Alternatively, the gating means may be provided by a layer or region of second conductivity type on the active region. In addition, the gating means may include an insulating region (e.g., oxide, undoped diamond, etc., and combinations thereof) on the active region, between the drain region and the source region.

A Hall effect sensor may also advantageously include the relatively low doped semiconducting active region according to the invention for enhanced thermal stability. The Hall effect sensor may include a wide bandgap semiconductor layer having the low doped semiconducting active region therein as described above, a first pair of spaced apart contacts on the semiconducting active region, and a second pair of spaced apart contacts on the active region transversely arranged relative to the first pair of contacts. Accordingly, the application of a voltage across the first pair of contacts causes a voltage across the second pair of contacts responsive to a magnetic field in the semiconducting active region. Alternatively, a Corbino disc may also be provided having a wide bandgap semiconductor active region extending between concentric electrodes.

A P-N junction may also include the relatively low doped semiconducting active region to provide enhanced thermal stability over a relatively wide temperature range. The P-N junction preferably includes a first layer comprising a wide bandgap semiconductor layer having an intentional dopant of a first conductivity type and an unintentional impurity of a second conductivity type at respective concentrations to together produce at room temperature a compensated majority free carrier concentration of first conductivity type. The intentional dopant concentration is preferably relatively low at less than $1\times10^{16}$ cm$^{-3}$ and supplies substantially all the majority free carriers in the wide bandgap semiconductor layer. A second layer includes a semiconductor material of second conductivity type on the first layer and forms a P-N junction therewith. The opposing ends of the P-N junction may be cleaved to thereby define a P-N junction laser as would be readily understood by those skilled in the art.

A piezoresistive transducer, piezoelectric transducer, bipolar transistor, charge-coupled device, and many other semiconductor devices, such as Corbino discs, thyristors and power MISFETs may also advantageously include the relatively low doped semiconducting active region according to the invention.

A method aspect of the present invention is for making a wide bandgap semiconductor device having enhanced thermal stability over a relatively wide temperature range. The method includes the steps of: forming a semiconducting active region in a wide bandgap semiconductor having an unintentional impurity of a second conductivity type by doping the wide bandgap semiconductor with an intentional dopant of a first conductivity type to a relatively low dopant concentration of less than $1\times10^{16}$ cm$^{-3}$ and so that unintentional impurity and intentional dopant have respective concentrations to together produce at room temperature a compensated majority free carrier concentration of first conductivity type. The step of forming the semiconducting active region preferably includes forming same in a wide bandgap material having an unintentional impurity concentration less than 0.1 times the intentional dopant concentration, and more preferably less than 0.01 times the intentional dopant concentration.

Considered somewhat differently, the step of forming the semiconducting active region preferably includes intentionally doping the wide bandgap semiconducting layer with an intentional dopant greater than the unintentional impurity concentration so that a difference between the intentional dopant concentration and the unintentional impurity concentration is less than 1000 times the free carrier concentration at room temperature, and more preferably less than 500 times the free carrier concentration at room temperature.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 4:
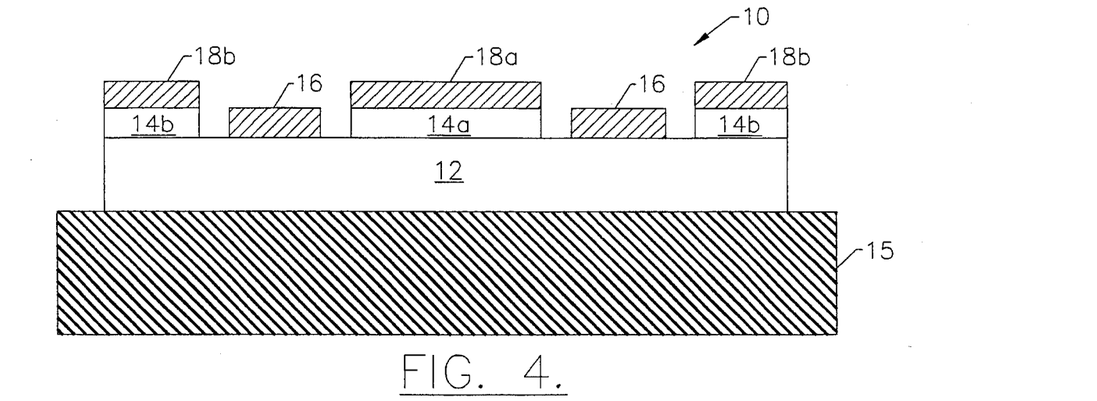
FIG. 4 is a schematic cross-sectional view of a field effect transistor according to the invention.

Referring now to FIG. 4, a first embodiment of a semiconductor device according to the present invention will be described. In particular, a field effect transistor (FET) 10 having a lightly doped wide bandgap semiconductor active region 12 according to the present invention is shown. The active region 12 may include any one of a number of suitable wide bandgap materials, which have bandgaps ($E_g = E_c - E_v$) greater that 1.5 eV. Typical materials for forming the active region include: diamond, IV-IV carbides such as SiC and $Si_xGe_yC_{1-x-y}$; III-V nitrides and phosphides such as cubic BN, CN, GaN, BP, $GaAs_{1-x}P_x$ (x=0.1→1) and $Al_xGa_{1-x}N_yP_{1-y}$; II-VI selenides, tellurides, oxides and sulfides such as $Zn_xCd_{1-x}S_ySe_{1-y}$, CdSe, CdS, ZnS, CdTe and ZnO.

As described below with respect to FIG. 8, the active region 12 includes an intentional N- or P-type dopant of first conductivity type such as boron (B), aluminum (Al), phosphorus (P), beryllium (Be), nitrogen (N). In addition, impurities such as Ga, Si, Ge, Sn, In, As, Sb, O, S, Se and Li which may have ionization activation energies greater than 150 meV in one or more of the aforementioned wide bandgap semiconductors are also included as potential dopants.

However, depending on the type of semiconductor used to form the active region, unintentional impurities may also be present in sufficient number to provide a non-negligible compensating effect vis-a-vis the intentional dopant. Therefore, according to one aspect of the present invention, the concentration of unintentional impurities in the active region is preferably less than one tenth or 0.1 times the intentional dopant concentration, which in turn is less than $1\times10^{16}$ cm$^{-3}$, as described more fully below. More preferably, the concentration of unintentional impurities in the active region is preferably less than 0.01 times the intentional dopant concentration.

The FET 10 further comprises a central drain region 14a and a source region 14b, adjacent the active region 12. The drain and source regions 14a–b may be of either first or second conductivity type, depending on whether the FET 10 is an enhancement- or depletion-mode FET. The drain and source regions are preferably highly doped (i.e., N$^+$ or P$^+$). As will be understood by those skilled in the art, the source region 14b may be configured in the shape of a concentric ring with respect to the conductive gate electrode 16, which, in turn, may include a metal or a suitable conductive material such as polysilicon. According to the first embodiment, the gate electrode 16 forms a Schottky barrier rectifier with the lightly doped active region 12 and modulates the conductivity of the active region 12 in response to an appropriate gate bias signal and defining a MESFET as would be readily understood by those skilled in the art.

Drain and source contacts 18a and 18b, which ohmically contact drain and source regions 14a and 14b, respectively, are also provided. As will be understood by those skilled in the art, the formation of an ohmic contact to a low doped active region typically requires the inclusion of a relatively highly doped surface region adjacent the contact electrode. As illustrated, free carrier conduction between the drain and source regions 14a–b may be constrained by the presence of an electrical insulating layer 15. Silicon dioxide ($SiO_2$) or undoped insulating diamond may be used as an insulating layer 15 for a transistor having a lightly doped diamond active region 12.

Figure 5:
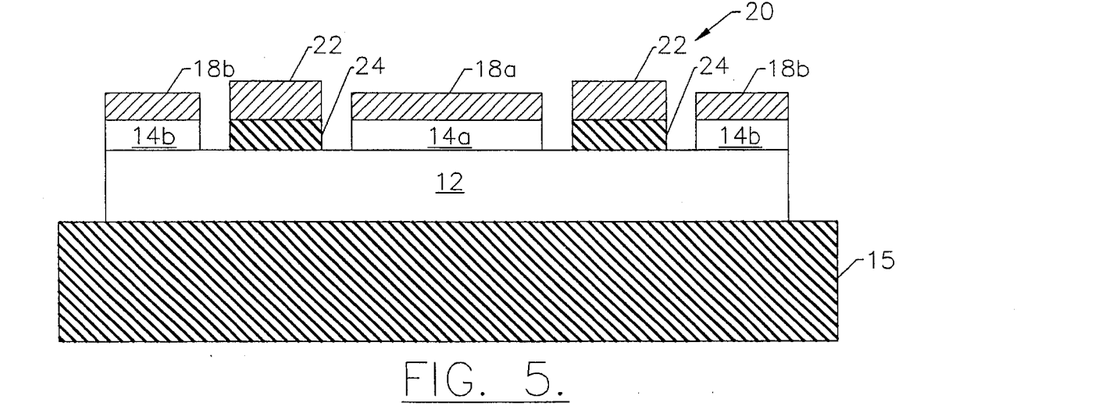
FIG. 5 is a schematic cross-sectional view of another field effect transistor according to the invention.
Figure 6:
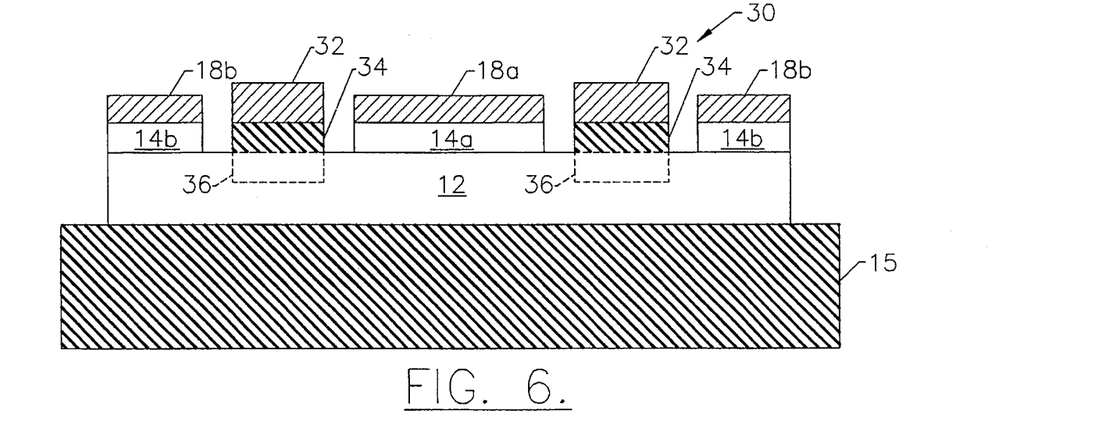
FIG. 6 is a schematic cross-sectional view of yet another field effect transistor according to the invention.

Referring now to FIGS. 5 and 6, second and third embodiments of the present invention which include a MISFET 20 and JFET 30, respectively, will be described. In particular, the MISFET 20 of FIG. 5 includes a conductive gate electrode 22, which is electrically insulated from the active region 12 by an electrical insulating region 24, such as $SiO_2$ or insulating diamond, for example. The JFET 30 of FIG. 6 includes a conductive gate electrode 32 which ohmically contacts a relatively highly doped junction gate region 34 of second conductivity type. As will be understood by those skilled in the art, a depletion region, indicated by 36, extends into the active region 12 at zero potential gate bias and preferably pinches-off the active region 12 when the P-N junction formed by regions 34 and 12 is sufficiently reversed biased. Moreover, the thickness of the active region 12 can be adjusted to adequately account for a relatively low doping level as described in greater detail below. In particular, for the field effect transistor embodiments 10, 20 and 30, the thickness of the active region 12 should be increased to account for the lower doping level and provide channel pinch-off at the desired gate voltage.

Figure 7:
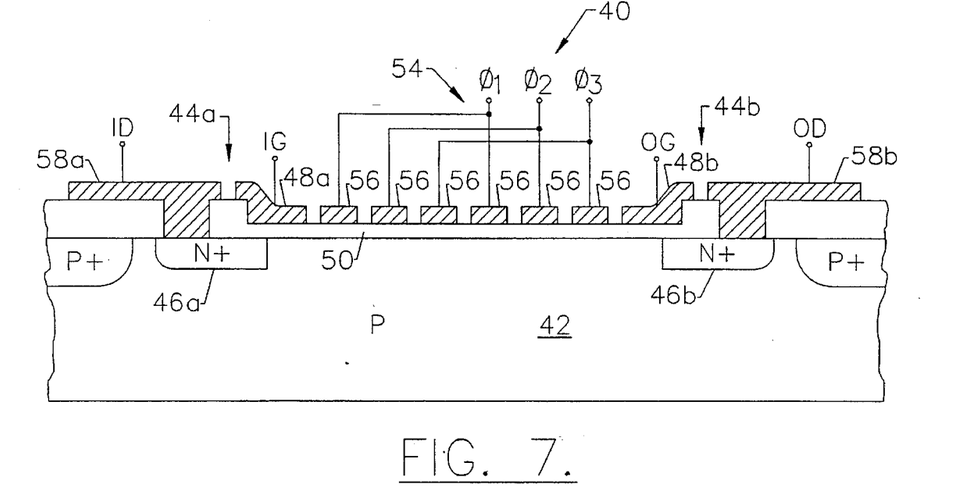
FIG. 7 is a schematic cross-sectional view of a charge-coupled device according to the invention.

Referring now additionally to FIG. 7, a fourth embodiment of a semiconductor device according to the present invention is explained including a relatively lightly doped active region. The illustrated embodiment includes a plurality of MIS diodes in a lightly doped wide bandgap semiconductor active region, such as defining a three phase charge-coupled device (CCD) 40. The CCD 40 includes an active region 42 of first conductivity type, shown as P-type, and respective gate controlled input and output diodes 44a and 44b.

The input and output diodes 44a–b have regions of second conductivity type 46a and 46b (shown as N-type) for injecting charge carriers of second conductivity type to the active region 42 in response to the application of appropriate gate biases to input and output gates 48a and 48b. Regions 46a–b also ohmically contact input and output electrodes 58a–b, as shown. An insulating layer 50 such as $SiO_2$ is also provided on a face of the active region 42. A plurality of gating means 54, comprising illustratively six (6) MIS diodes having gates 56, are also provided for independently controlling the conductivity of respective portions of the active region 42 in response to the application of respective gate bias signals to control electrodes $\phi_{1-3}$.

As will be understood by those skilled in the art, upon the injection of second conductivity type charge carriers by the gate controlled input diode 44a, sequential control of the electrodes $\phi_{1-3}$ can be performed to transfer the injected charge carriers across the active region and to the gate controlled output diode 44b. As with each of the above-described semiconductor FET embodiments 10, 20 and 30, the active region 42 of the CCD 40 is preferably doped with one of the aforementioned first conductivity type dopants to a concentration less than $1\times10^{16}$ cm$^{-3}$ in order to achieve relatively uniform device characteristics over a relatively wide temperature range, such as from at least about room temperature to upwards of 1000° C.

Compensation effects, caused by the presence of unintentional impurities of second conductivity type in the active region 42 are preferably minimized by maintaining the unintentional impurity concentration below at least 0.1 times the intentional first conductivity type dopant concentration and preferably below 0.01 times that value, using processing techniques known by those skilled in the art.

The requirement that the active region have a doping level below $1\times10^{16}$ cm$^{-3}$ renders devices formed of wide bandgap semiconductor material less sensitive to fluctuations in operating temperature. In particular, wide bandgap semiconductors have typically had characteristics, such as resistivity ($\rho$), which are sensitive to fluctuations in operating temperature and which make them ideally suited for thermistor applications, etc. This is particular true for wide bandgap semiconductors having relatively deep level dopants, i.e., dopants having activation energies greater than 150 meV.

However, in accordance with the present invention, relatively uniform device characteristics may be achieved by lightly doping wide bandgap semiconductor active regions. This is in sharp contrast to prior devices which include a highly doped active region in order to obtain a reduction in the dopant ionization energy ($E_a$ or $E_d$) or require the supply of free charge carriers from adjacent regions.

Figure 8:
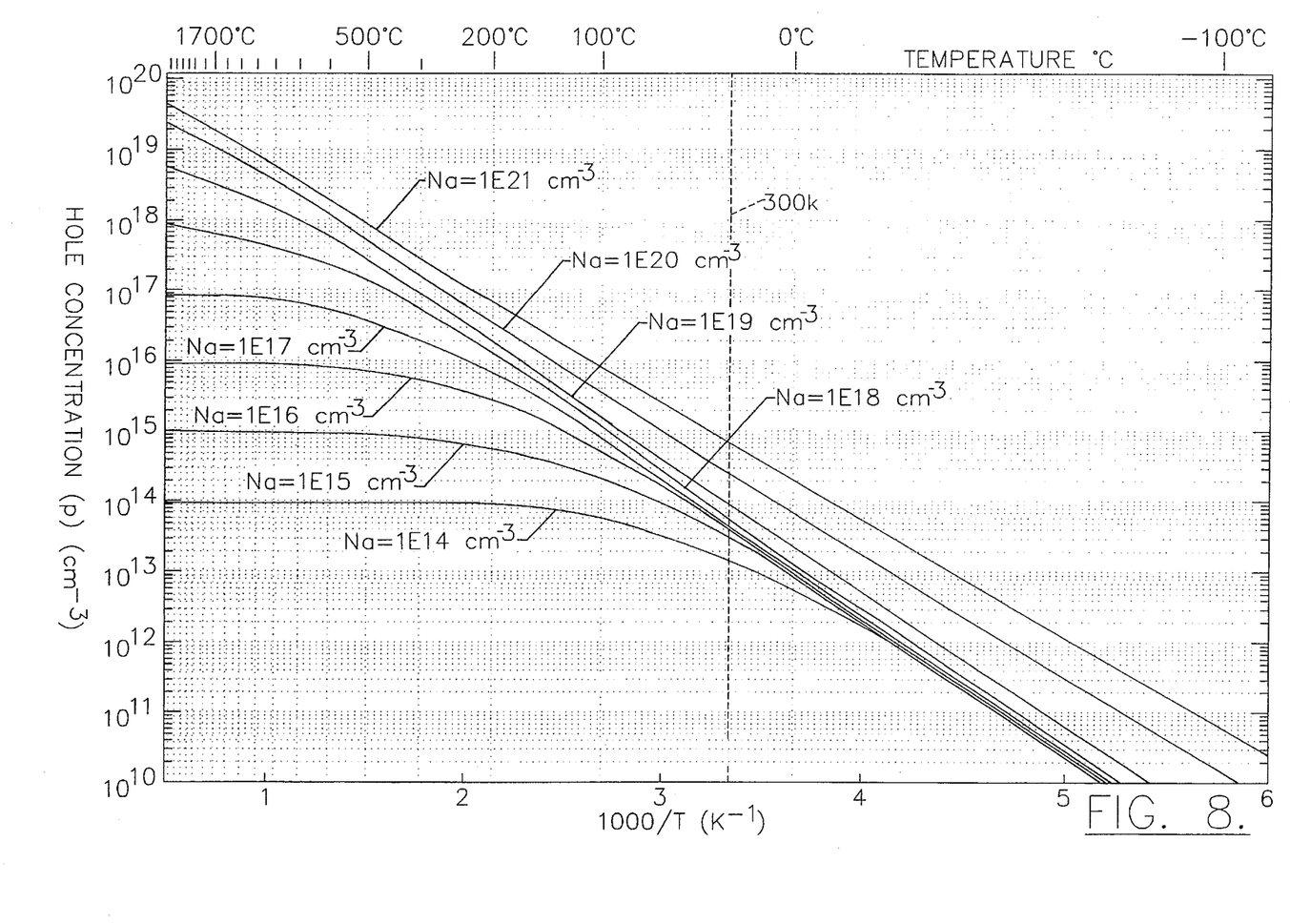
FIG. 8 is a graph illustrating hole concentration versus inverse temperature for various intentional dopant levels and with an impurity concentration of 0.1 times the intentional dopant concentration in accordance with the invention.

Referring now to FIG. 8, a first graphical illustration of calculated free hole carrier concentration (p) versus reciprocal temperature for a diamond active region is provided. The diamond active region has an intentional acceptor (boron) concentration ($N_a$) in the range of $1\times10^{14}$ cm$^{-3}$–$1\times10^{21}$ cm$^{-3}$ and an unintentional donor (nitrogen) concentration $N_d$=0.1 $N_a$. As shown, the majority free carrier concentration (p=$N_a^- - N_d^+$) at room temperature is greater than $1\times10^{-3}$ times $N_a$ (and $N_a - N_d$) for diamond having a boron concentration less than or equal $1\times10^{16}$ cm$^{-3}$. However, for boron concentrations equal to $1\times10^{17}$ cm$^{-3}$ and higher, the majority free carrier concentration at room temperature is less than $1\times10^{-3}$ times $N_a$. The illustrations of free hole carrier concentration versus reciprocal temperature were based on the following equation, where T is the temperature (K); m* is the effective mass of the holes in diamond; $E_a$ is the activation energy for boron in diamond; h is Planck's constant and k is Boltzmann's constant:

$$p(p+N_d) = (N_a - N_d - p)\left(\frac{2\pi m^* T}{h^2}\right)^{3/2} \exp\left(\frac{-E_a}{kT}\right)$$

Figure 9:
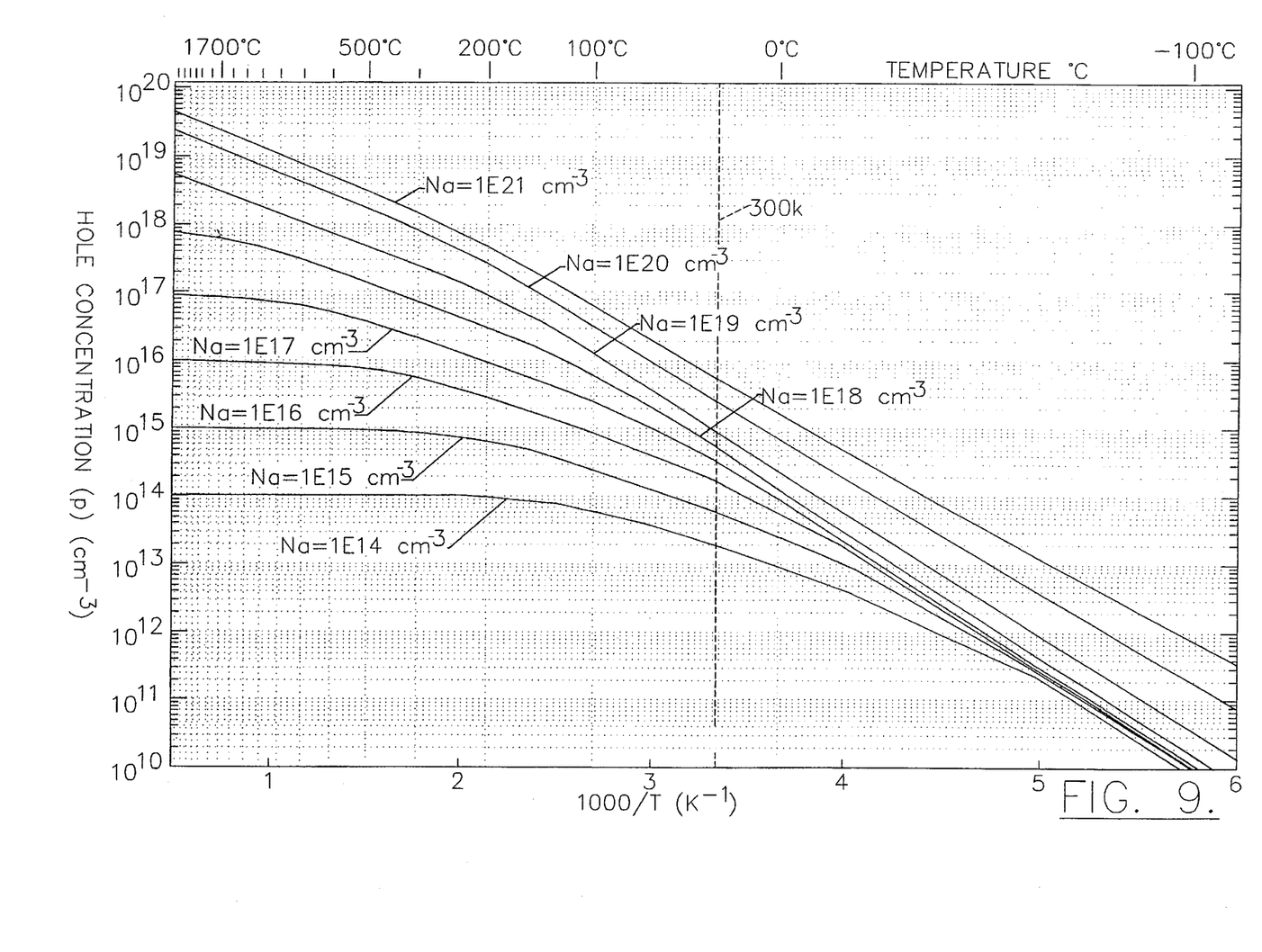
FIG. 9 is a graph illustrating hole concentration versus inverse temperature for various intentional dopant levels and with an impurity concentration of 0.01 times the intentional dopant concentration in accordance with the invention.

Referring now additionally to FIG. 9, a second graphical illustration of free hole carrier concentration (p) versus reciprocal temperature for a diamond active region is provided. The diamond active region has an intentional acceptor (boron) concentration ($N_a$) in the range of $1\times10^{14}$ cm$^{-3}$–$1\times10^{21}$ cm$^{-3}$ and an unintentional donor (nitrogen) concentration $N_d$=0.01 $N_a$. As shown, the free carrier concentration (p=$N_a^- - N_d^+$) at room temperature is greater than $1\times10^{-2}$ times $N_a$ (and $N_a - N_d$) for diamond having a boron concentration less than or equal $1\times10^{16}$ cm$^{-3}$. However, for boron concentrations equal to $1\times10^{17}$ cm$^{-3}$ and higher, the free carrier concentration at room temperature is less than $1\times10^{-2}$ times $N_a$. Moreover, for other wide bandgap semiconductors having intentional dopant concentrations less than $1\times10^{16}$ cm$^{-3}$ and unintentional impurity concentrations less than 0.01 times the intentional dopant concentration, the majority free carrier concentration at room temperature is greater than $1\times10^{-2}$ times $N_a - N_d$ for intentional dopants having activation energies greater than 150 meV in the respective wide bandgap semiconductor.

Figure 10:
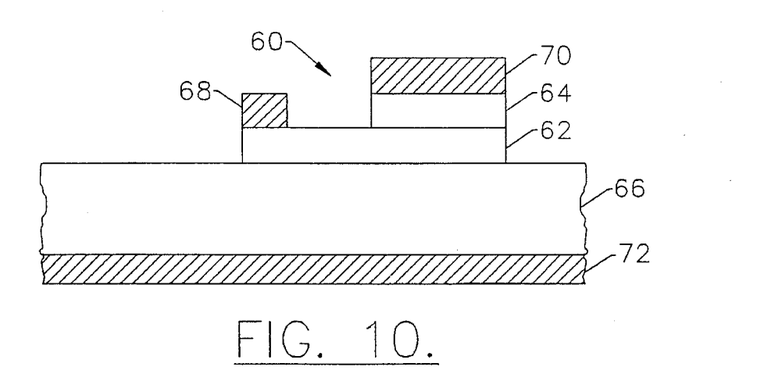
FIG. 10 is a schematic cross-sectional view of a bipolar transistor according to the invention.
Figure 11:
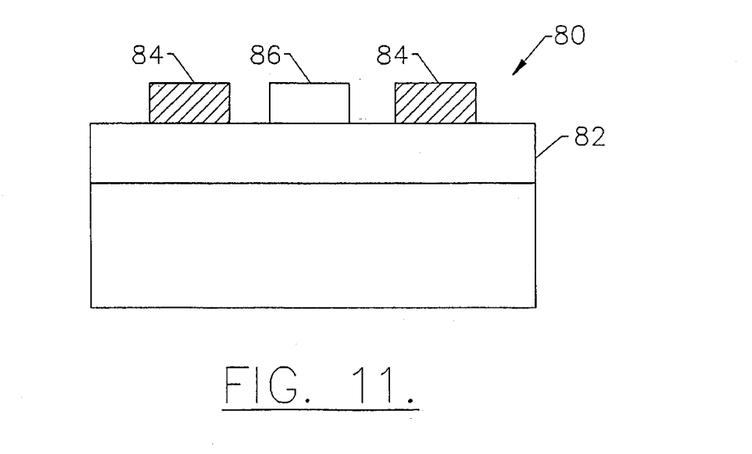
FIG. 11 is a schematic cross-sectional view of a Hall effect sensor according to the invention.
Figure 12:
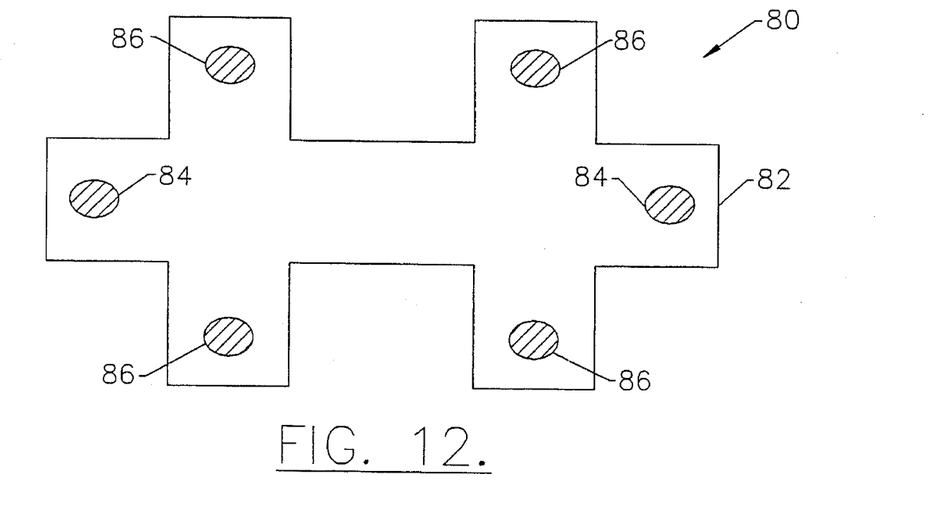
FIGS. 12–15 are schematic plan views of various Hall effect sensor embodiments according to the present invention.
Figure 13:
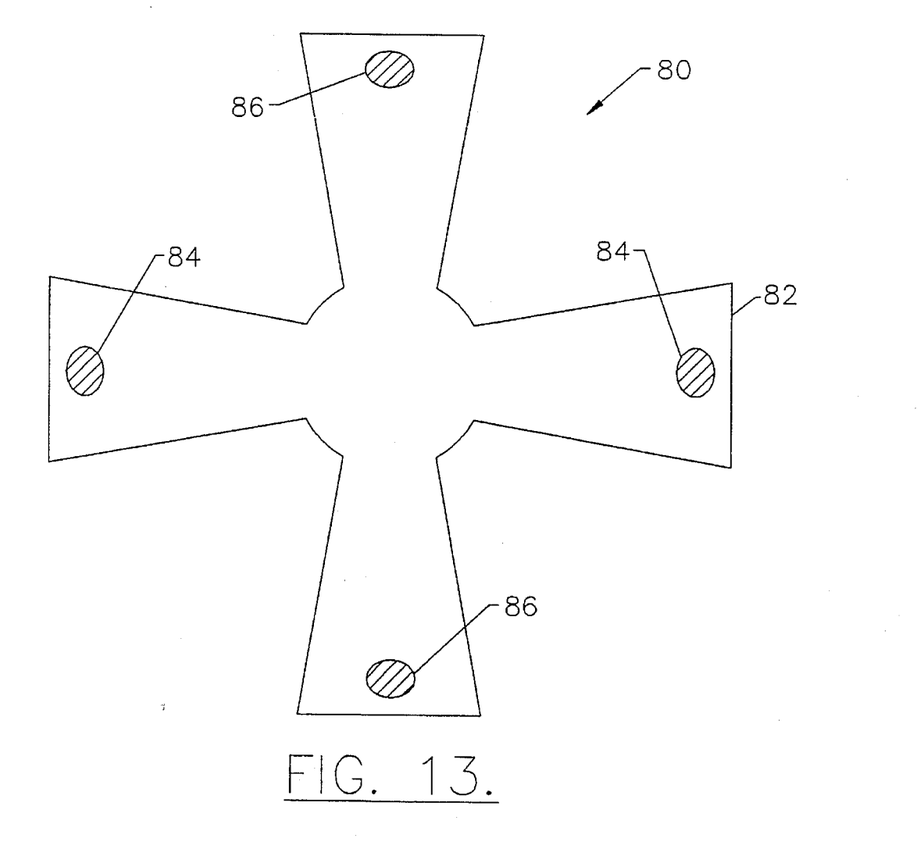
Figure 14:
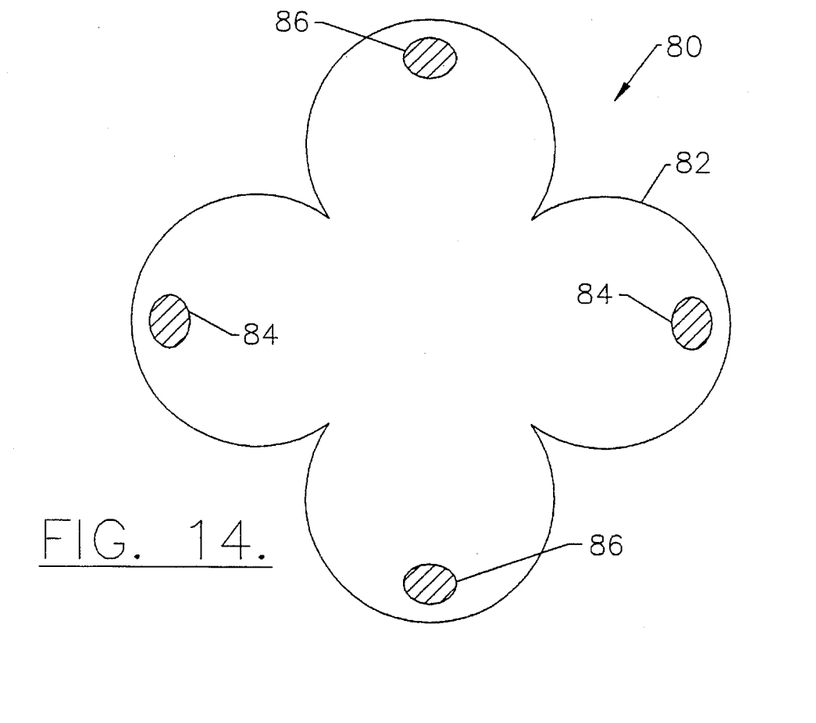
Figure 15:
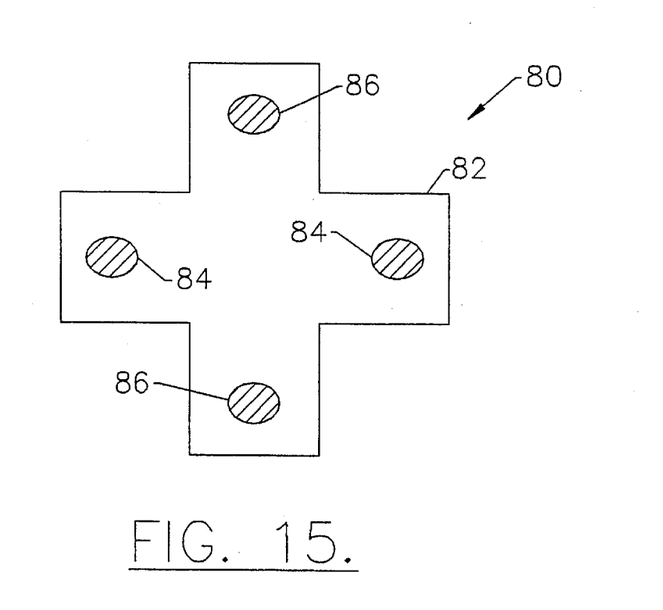

The present invention may also include a bipolar junction transistor having at least one low doped wide bandgap semiconductor layer which forms the base, emitter and/or collector. For example, as illustrated by FIG. 10, a bipolar transistor 60 may include a wide bandgap semiconductor base layer 62 according to the present invention. In particular, the base layer 62 preferably has a first conductivity type intentional dopant concentration and an unintentional impurity of a second conductivity type which together produce a free carrier concentration at room temperature. The intentional dopant concentration is less than $1\times10^{16}$ cm$^{-3}$ and is also less than 1000 times the majority free carrier concentration at room temperature and more preferably, less than 100 times the majority free carrier concentration at room temperature. Moreover, the thickness of the base layer 62 may be suitably sized to account for the relatively low doping level and provide proper base characteristics, such as base transit time and punchthrough, etc. as would be readily understood by those skilled in the art.

The illustrated bipolar transistor 60 further includes a second conductivity type emitter 64 and collector 66, which form P-N junctions with the wide bandgap base layer 62. Base, emitter and collector contacts 68–72 are also provided for ohmically contacting the respective base layer, emitter and collector. Although not shown, the ohmic contact to the base region preferably includes a relatively highly doped semiconductor region of first conductivity type adjacent the base region.

In particular, the base layer 62 is a wide bandgap semiconductor selected from the group consisting of diamond, IV-IV carbides, III-V nitrides and phosphides and II-VI selenides, tellurides, oxides and sulfides. The emitter 64 and collector 66 may also be formed of a wide bandgap semiconductor such as diamond. Accordingly, the transistor 60 may define a double heterojunction P-N-P transistor having a diamond emitter 64, silicon carbide base layer 62 and diamond collector 66.

Referring now to FIGS. 11–15, various embodiments of a Hall effect sensor 80 according to the present invention are explained. The sensor 80 includes a relatively lightly doped wide bandgap semiconductor active region 82 in accordance with the present invention. The active region 82 is doped to a value less than $1\times10^{16}$ cm$^{-3}$ and less than 1000 times the majority free carrier concentration at room temperature, which depends on the concentration of the unintentional impurity and the activation energy of the intentional dopant in the respective wide bandgap semiconductor. The sensor further includes at least two pairs of transversely aligned and spaced apart ohmic contacts 84 and 86 on the active region 82. FIGS. 12–15 are top elevational views of the pairs of contacts on variously shaped active regions 82. The embodiment of FIG. 15, which has two pairs of contacts 86, is preferably used in conjunction with anisotropic wide bandgap semiconductor active regions. As will be understood by those skilled in the art, the application of a bias potential across a first pair of contacts 84 will induce a potential across the second pair of contacts 86 upon the occurrence of a magnetic field in the active region and having a field component extending in the z-direction, as shown.

Figure 16:
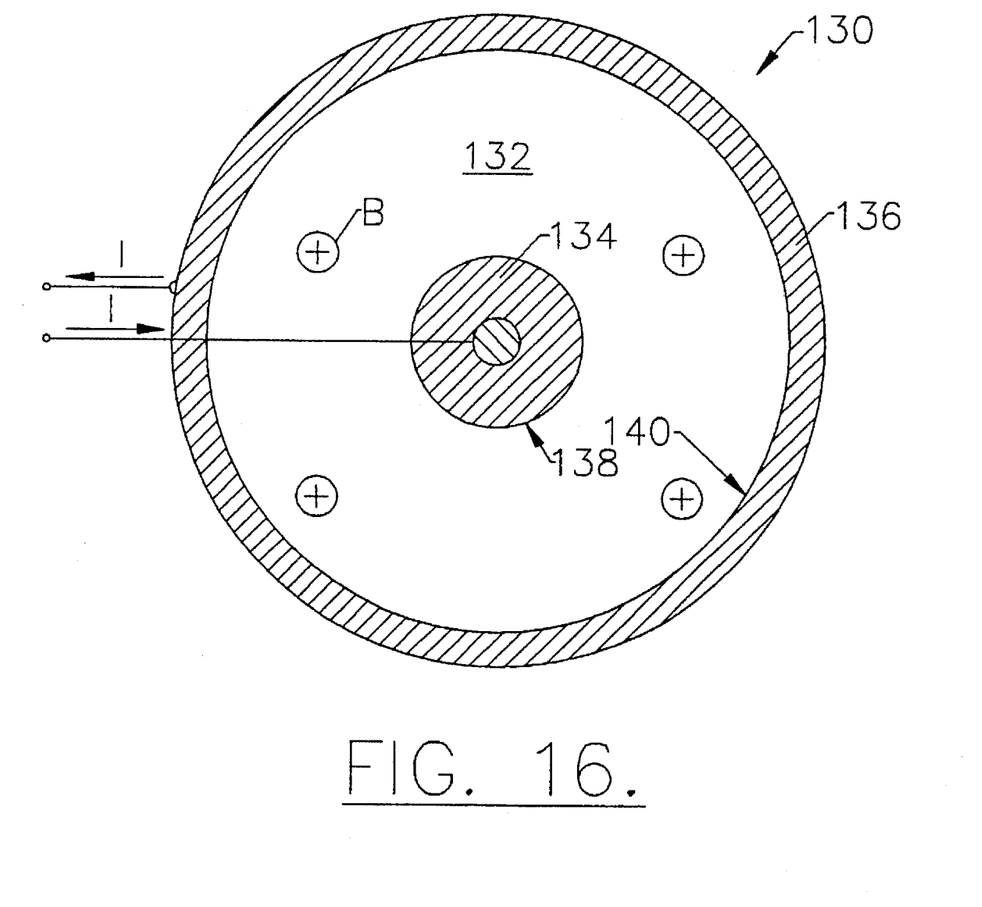
FIG. 16 is a schematic cross-sectional view of a Corbino disc according to the present invention.

Referring now to FIG. 16, a Corbino disc 130 according to the present invention includes a lightly doped wide bandgap semiconductor ring having an active region 132 therein. A first electrode 134 in the center of the ring and a second electrode 136 surrounding the ring are also included. The first electrode 134 ohmically contacts the active region 132 adjacent an inner circumference 138 and the second electrode 136 ohmically contacts the active region 132 adjacent an outer circumference 140. As will be understood by those skilled in the art, the Corbino disc produces a current density J(B) between the electrodes which is functionally dependent on the magnitude of a perpendicular magnetic field B, as shown.

Figure 17:
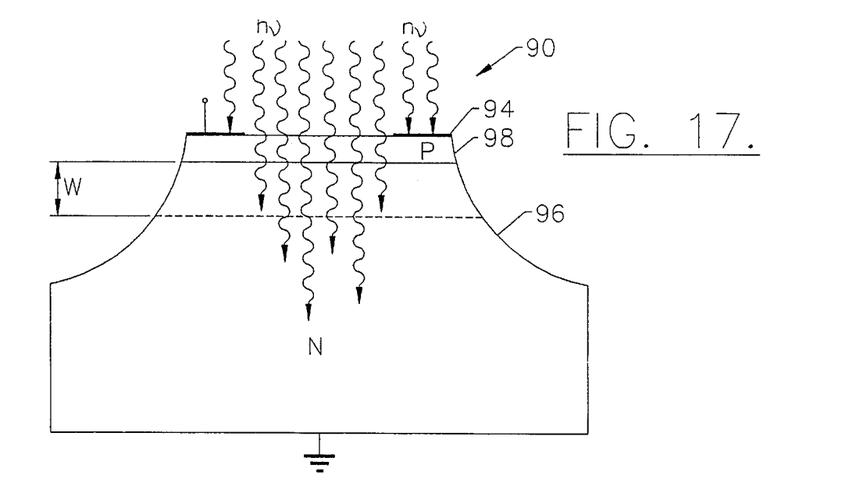
FIG. 17 is a schematic cross-sectional view of a P-N junction device according to the invention.

Referring now to FIG. 17, a P-N junction photodiode 90 according to the present invention will be described. The photodiode 90 may function as either a photodetector or photovoltaic cell using conventional design and biasing techniques. In the illustrated embodiment, the photodiode has a face 94 for receiving coherent or incoherent light from an external source (not shown). The photodiode 90 includes a relatively lightly doped wide bandgap semiconductor active region 96 (e.g., N-type) and a semiconductor layer 98 of second conductivity type (e.g., P-type), between the active region and the face 94. As will be understood by those skilled in the art, the semiconductor layer 98 is preferably thinner than the active region 96 and is typically doped higher than the active region. By doping layer 98 to a value above the active region 96, the width of the depletion region formed by the P-N junction will approximately equal the width of the depletion region on the active region side (shown as W).

Figure 18:
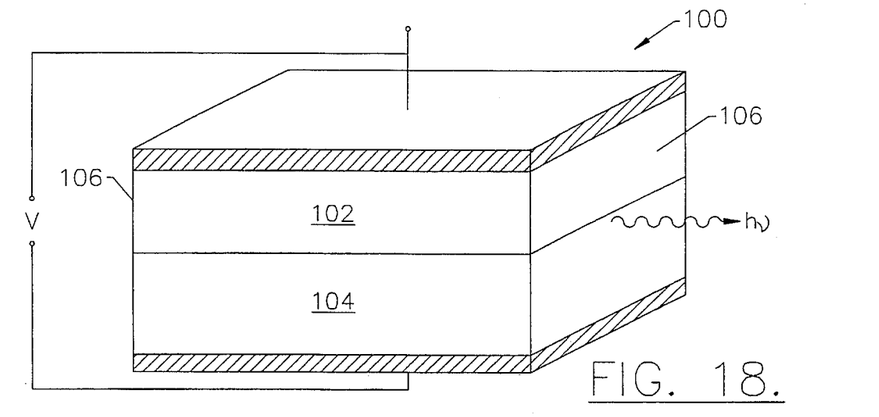
FIG. 18 is a schematic cross-sectional view of a P-N junction laser according to the invention.

Referring now to FIG. 18, a wide bandgap P-N junction semiconductor laser 100 according to the present invention comprises first and second layers 102 and 104 of opposite conductivity type. The first layer 102 has first and second ends 106 thereof and includes an intentional dopant of first conductivity type. The concentration of the intentional dopant is preferably less than $1\times10^{16}$ cm$^{-3}$ and less than 1000 times the majority free carrier concentration in the first layer at room temperature. The second layer 104 of second conductivity type extends between the first and second ends 106 and forms a P-N junction with the first layer 102, as shown. The ends 106 are preferably cleaved faces which extend parallel to each other and promote the stimulated emission of radiation at the junction, upon the application of a forward biased potential (V).

Figure 19:
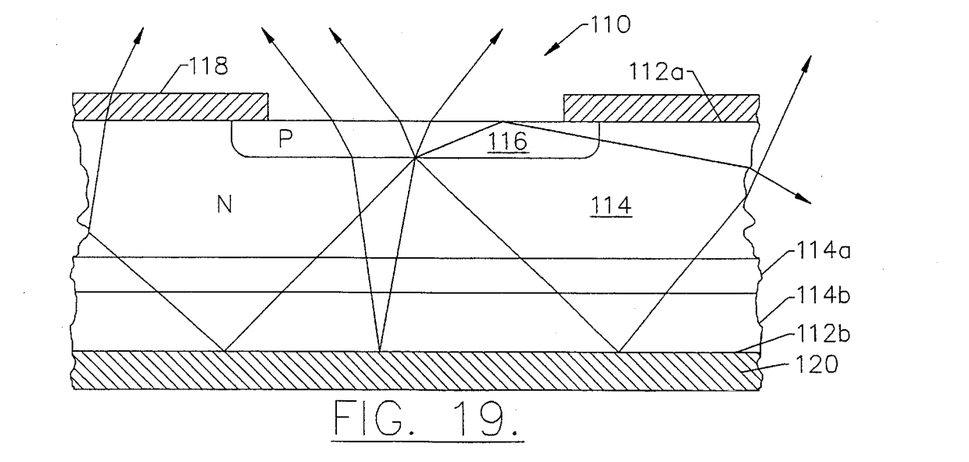
FIG. 19 is a schematic cross-sectional view of a P-N junction light emitting diode (LED) according to the invention.

Referring now to FIG. 19, a light emitting diode (LED) 110 having an intentionally doped first conductivity type active region 114 according to the present invention is provided. The LED has first and second opposing faces 112a–b and a region of second conductivity type 116 (shown as P-type) is also provided at the first face 112a and forms a P-N junction with the active region 114. Ohmic contacts 118 and 120 are also provided on the faces for electrically contacting the P-N junction and biasing the junction to cause the emission of photons from the first face 112a. The contact 120 on the second face 112b may also include an optically reflective surface for preventing the emission of photons from the second face and for reflecting photons towards the first face 112a, as shown.

In a preferred embodiment of the LED 110 the active region 114 may be formed of a wide bandgap semiconductor such as GaAs$_{1-x}$P$_x$, which has a direct bandgap greater than 1.5 eV for (0.1<x<0.4) and which is intentionally doped to a concentration less than $1\times10^{16}$ cm$^{-3}$. An optically transparent region 114b, such as GaP, may also be provided between the active region 114 and the second face 112b in order to enhance the photon emitting efficiency of the diode 110. In addition, a graded region 114a is preferably provided between the active region 114 and the optically transparent region 114b so that a lattice discontinuity does not occur at their interface. The graded region preferably includes GaAs$_{1-x}$P$_x$ for (0.1<x<1.0).

Figure 20:
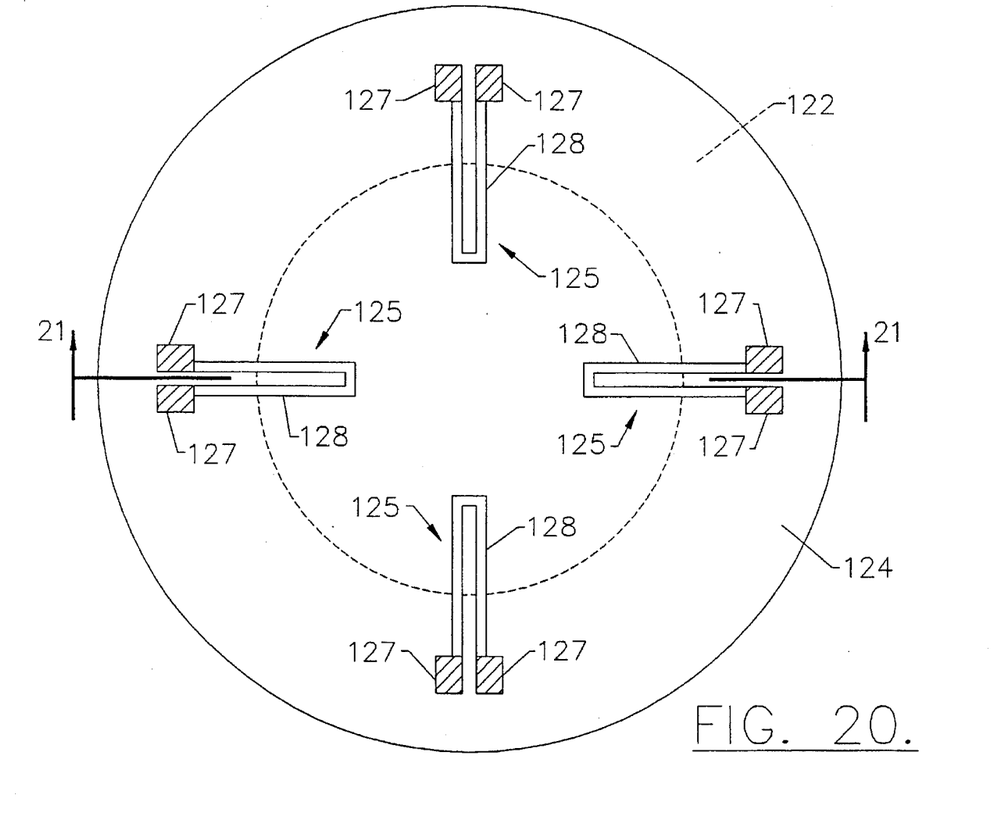
FIG. 20 is a schematic plan view of a transducer according to the invention.
Figure 21:
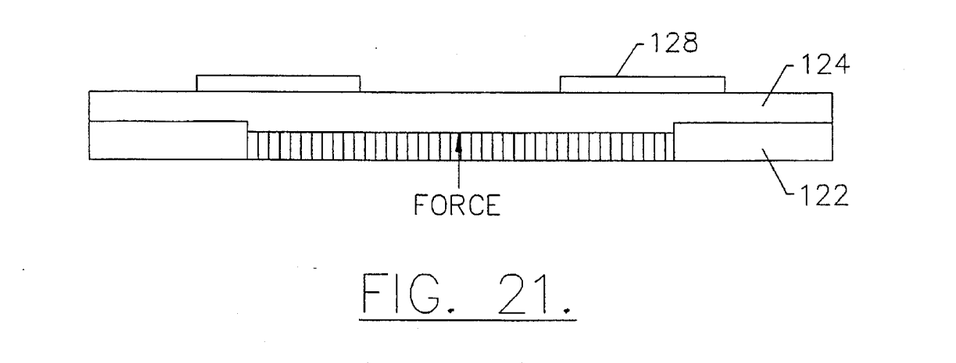
FIG. 21 is a cross-sectional view of the transducer taken along lines 21—21 of FIG. 20.

Referring now to FIGS. 20–21, a sensor 120 according to the present invention is explained. The sensor 120 can be a piezoresistive sensor (e.g., diamond) or a piezoelectric sensor (e.g., GAN). The piezoresistive sensor 120 includes an annular supporting substrate or supporting ring 122 on which a flexible layer 124 is positioned. The layer 124 provides a diaphragm for the sensor 120. A plurality of doped diamond sensing fingers 125 are on top of the layer 124 so that relatively lightly doped diamond legs 128 extend inwardly on the diaphragm and over the cavity defined by the supporting substrate. In the illustrated embodiment, four fingers 125 are supported by the layer 124, which may be undoped insulating diamond or another suitable material. Each finger includes a lightly doped diamond leg 128 and a contact portion 127 as shown.

Each of the above described embodiments includes at least one wide bandgap semiconductor region having an intentional dopant concentration of less than $1\times10^{16}$ cm$^{-3}$ which supplies substantially all of the majority free carriers in the respective wide bandgap semiconductor region and adjacent regions are not required to supply a substantial number of majority free carriers. The unintentional impurity concentration is also preferably less than the unintentional dopant concentration so that a difference between the intentional dopant concentration and the unintentional impurity concentration is less than 1000 times the free carrier concentration in the wide bandgap region at room temperature. Thus, devices having a wide bandgap semiconductor according to the present invention have enhanced thermal stability extending from room temperature to 1000 K and above.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A semiconductor device having enhanced thermal stability over a relatively wide temperature range and comprising:

a diamond layer having a semiconducting active region therein and a drain region and a source region adjacent said semiconducting active region;

an insulating layer adjacent said semiconducting active region; and gating means on said insulating layer for modulating said semiconducting active region so that the semiconductor device is an insulated-gate field effect transistor;

said semiconducting active region including an intentional dopant of a first conductivity type and an unintentional impurity of a second conductivity type at respective concentrations to together produce at room temperature a compensated majority free carrier concentration of first conductivity type; and said intentional dopant concentration being relatively low at less than $1\times10^{16}$ cm$^{-3}$ and supplying substantially all the majority free carriers in said active region when conduction in said active region is dominated by majority carrier transport and not by minority carrier transport, to thereby enhance thermal stability for the semiconductor device over a relatively wide temperature range, wherein the unintentional impurity concentration is less than 0.1 times the intentional dopant concentration.

2. A semiconductor device having enhanced thermal stability over a relatively wide temperature range and comprising:

a diamond layer having a semiconducting active region therein and a drain region and a source region adjacent said semiconducting active region;

an insulating layer adjacent said semiconducting active region; and gating means on said insulating layer for modulating said semiconductor active region so that the semiconductor device is an insulated-gate field effect transistor;

said semiconducting active region including an intentional dopant of a first conductivity type and an unintentional impurity of a second conductivity type at respective concentrations to together produce at room temperature a predetermined compensated majority free carrier concentration of first conductivity type; and said intentional dopant concentration being relatively low at less than $1\times10^{16}$ cm$^{-3}$ and supplying substantially all of the majority free carriers in said active region when conduction in said active region is dominated by majority carrier transport and not by minority carrier transport, and the unintentional impurity concentration being less than the intentional dopant concentration so that a difference between the intentional dopant concentration and the unintentional impurity concentration is less than 1000 times the predetermined compensated majority free carrier concentration to thereby enhance thermal stability for the semiconductor device over a relatively wide temperature range.

3. A semiconductor device having enhanced thermal stability over a relatively wide temperature range and comprising:

a wide bandgap semiconductor layer having a semiconducting active region therein and a drain region and a source region adjacent said semiconducting active region;

an insulating layer adjacent said semiconducting active region; and gating means on said insulating layer for modulating said semiconductor active region so that the semiconductor device is an insulated-gate field effect transistor;

said semiconducting active region including an intentional dopant of a first conductivity type and an unintentional impurity of a second conductivity type at respective concentrations to together produce at room temperature a compensated majority free carrier concentration of first conductivity type; and said intentional dopant concentration being relatively low at less than $\times10^{16}$ cm$^{-3}$ and supplying substantially all the majority free carriers in said active region when conduction in said active region is dominated by majority carrier transport and not by minority carrier transport, to thereby enhance thermal stability for the semiconductor device over a relatively wide temperature range, wherein the unintentional impurity concentration is less than 0.1 times the intentional dopant concentration.

4. An insulated-gate field effect transistor having enhanced thermal stability over a relatively wide temperature range, the insulated-gate field effect transistor comprising:

a wide bandgap semiconductor layer comprising a semiconducting active region including an intentional dopant of a first conductivity type and an unintentional impurity of a second conductivity type at respective concentrations to together produce at room temperature a compensated majority free carrier concentration of first conductivity type, said intentional dopant concentration being relatively low at less than $1\times10^{16}$ cm-3 and supplying substantially all the majority free carriers in said active region when conduction in said active region is dominated by majority carrier transport and not by minority carrier transport;

a source region and a drain region adjacent said active region; and gating means comprising an insulating region on said active region, for modulating said semiconducting active region, wherein the unintentional impurity concentration is less than 0.1 times the intentional dopant concentration.

5. A field effect transistor of claim 4, wherein said wide bandgap semiconductor has a bandgap energy greater than 1.5 eV.

6. A field effect transistor of claim 4, wherein the unintentional impurity concentration is less than 0.01 times the intentional dopant concentration.

7. A field effect transistor of claim 4, wherein said intentional dopant has an ionization activation energy greater than 150 meV in said semiconducting diamond layer.

8. A field effect transistor of claim 4, wherein said wide bandgap semiconductor is selected from the group consisting of diamond, IV-IV carbides, III-V nitrides and phosphides and II-VI selenides, tellurides, oxides and sulfides.

9. A field effect transistor of claim 4, wherein the unintentional impurity concentration is less than the intentional dopant concentration so that a difference between the intentional dopant concentration and the unintentional impurity concentration is less than 1000 times the free carrier concentration at room temperature.

10. A field effect transistor of claim 4, wherein the unintentional impurity concentration is less than the intentional dopant concentration so that a difference between the intentional dopant concentration and the unintentional impurity concentration is less than 500 times the free carrier concentration at room temperature.

* * * * *